(12) United States Patent
Choi

(10) Patent No.: US 6,514,819 B1
(45) Date of Patent: Feb. 4, 2003

(54) HIGH CAPACITY STACKED DRAM DEVICE AND PROCESS FOR MAKING A SMALLER GEOMETRY

(75) Inventor: Kyu Hyun Choi, Cupertino, CA (US)

(73) Assignee: Ace Memory, Inc., Cupertino, CA (US)

( * ) Notice: Subject to any disclaimer, the term of this patent is extended or adjusted under 35 U.S.C. 154(b) by 0 days.

(21) Appl. No.: 09/258,596

(22) Filed: Feb. 26, 1999

Related U.S. Application Data

(63) Continuation of application No. 08/609,846, filed on Mar. 1, 1996, now Pat. No. 5,946,566.

(51) Int. Cl.⁷ .......................................... H01L 21/8242
(52) U.S. Cl. ...................... 438/253; 438/396; 438/393; 438/397; 438/250; 438/254; 438/669; 438/738
(58) Field of Search ................................ 438/239, 253, 438/391, 396, 669, 738

(56) References Cited

U.S. PATENT DOCUMENTS

| | | | | |
|---|---|---|---|---|
| 4,648,937 A | * | 3/1987 | Ogura et al. ................. | 438/702 |
| 4,776,922 A | * | 10/1988 | Bhattacharyya et al. .... | 438/696 |
| 4,838,991 A | * | 6/1989 | Cote et al. ................... | 156/643 |
| 5,084,405 A | * | 1/1992 | Fazan et al. ................. | 437/52 |
| 5,266,512 A | * | 11/1993 | Kirsch ......................... | 438/253 |
| 5,399,518 A | * | 3/1995 | Sim et al. .................... | 438/396 |
| 5,712,182 A | * | 1/1998 | Madan ......................... | 438/253 |

* cited by examiner

Primary Examiner—John F. Niebling
Assistant Examiner—Jennifer M. Kennedy
(74) Attorney, Agent, or Firm—Townsend and Townsend and Crew, LLP

(57) ABSTRACT

A DRAM having a theoretical cell layout efficiency of 100% and a density of up to four gigabits DRAM is obtained without sacrificing the storage capacitor values. This accomplishment is achieved by introducing landing pads in layout and obtaining narrow widths down to 1000A and small spaces down to 700 Å. The DRAM has active isolations, word lines, cup-shaped vertical capacitor walls, and bit lines. The process for forming small dimensions having this narrow width, narrow wall and the small space in ranges down 800 Å comprises depositing a form material on the surface of a product material. A portion of the form material is removed by RIE etching by using the lithography technique. A layer of masking material is deposited over the form material and product material, the layer of masking material having a thickness correlating to said desired width of product material. Masking material is removed by vertical RIE until the form material is exposed, leaving a predetermined width of masking material. Portions of the product material which are not protected by the masking material are removed to leave a desired width of product material corresponding to the width of the masking material. The corresponding process can be used to form spacings of corresponding dimensions.

10 Claims, 14 Drawing Sheets

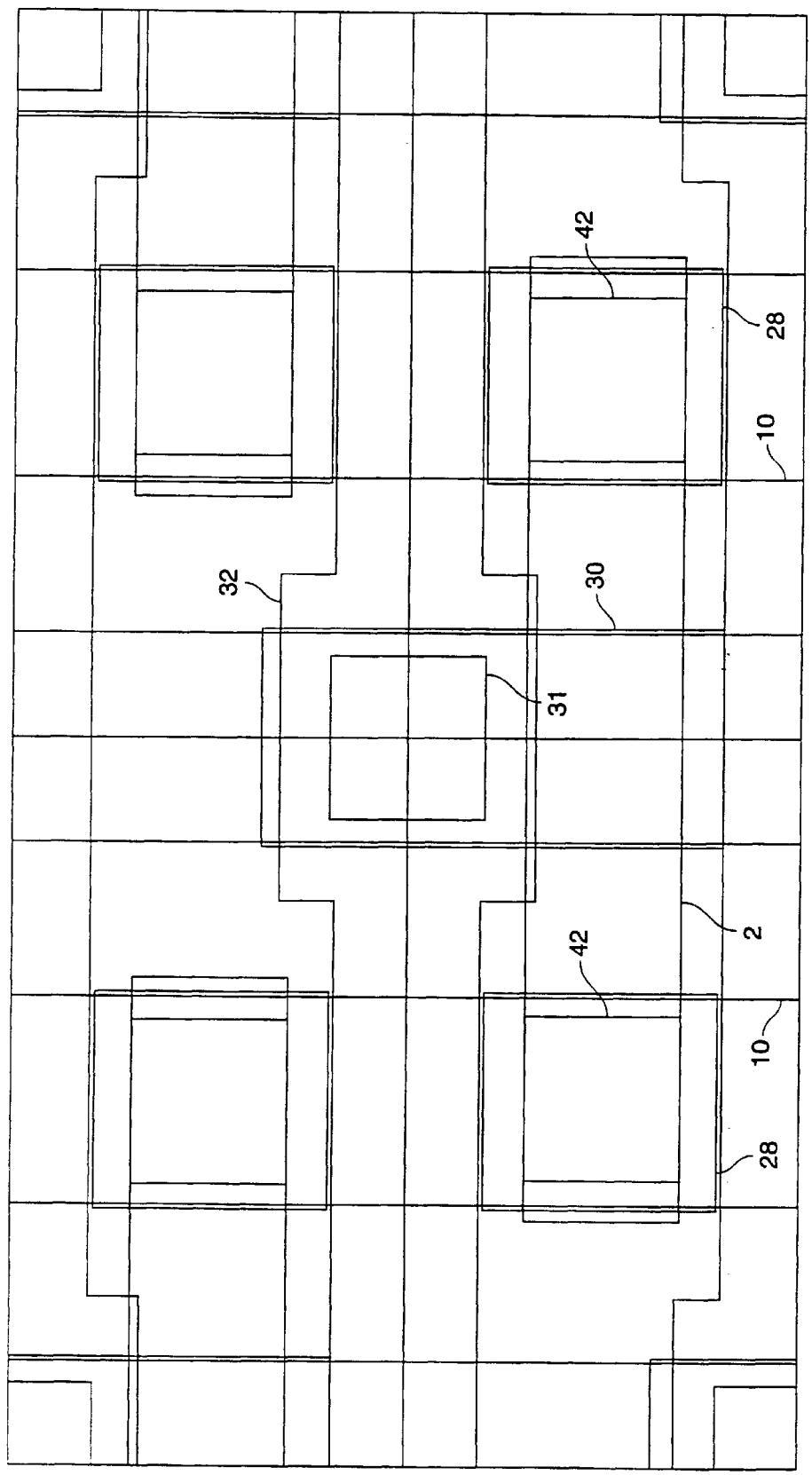

HIGH CAPACITY STACKED DRAM DEVICE AND PROCESS FOR MAKING A SMALLER GEOMETRY

This is a continuation of application Ser. No. 80/609,846, filed Mar. 1, 1996, now U.S. Pat. No. 5,946,566.

FIELD OF THE INVENTION

This invention relates to an high capacity DRAM device having a smaller cell size as well as having a higher storage capacity. This process also relates to a process for preparing "memories" and other semiconductor devices with smaller dimensions and precise controls. In particular, this invention relates to a process for preparing DRAM's having a smaller cell size with high storage capacities and the cell layout of a high density DRAM product having a capacity as high as four gigabits.

BACKGROUND OF THE INVENTION

In recent years, in the area of semiconductor memory devices such as DRAM, 4M and 16M DRAMs have been mass-produced, and 64M DRAMs have been studied. In DRAMs, the typical three dimensional structures such as a trench type and a stack type have been developed. The trench type is manufactured in a groove provided on the semiconductor substrate, and the stack type is formed by laminating in three dimensions the conductive layers on the surface of the semiconductor substrate. The trench type has a flatter surface than the stack type, providing advantages for lithography but has serious operating disadvantages. The operation voltage is changed by leakage of current and punch-through between adjacent trenches. Electron-hole pairs generated by α-particles transmitted inside the substrate are also a problem.

The stack type is formed by laminating element layers on the substrate, and the fabrication process sequence is simpler than for the trench type and does not have the operating deficits noted above. As a result, the stack type is more attractive than the trench type.

A limiting factor in the construction of stack type DRAMs in smaller cell sizes is the minimum storage capacity of 25 fF required for proper operation of a DRAM, that is, the cell capacity required per cell and the practical limit of photolithography techniques for achieving smaller dimensions. As the memory device is made to be more highly integrated and thus smaller in size, the area occupied by each cell is reduced, thus reducing the area available for each capacitor. To be functionally operable, the capacitor must have a large capacity, even as the size of the memory cell is reduced.

The chip size of a DRAM product is determined by the formula:

Chip Area=$AP+AM$

Where:

AP is the Area of Peripheral circuits; and

AM is the Area of total Memory cells and is calculated by the formula:

AM=Total Bits (or density)×a Cell Area

Normally, AM occupies more than 55 percent of the total chip area in a high density DRAM. Because the smaller the chip size, the lower the production cost, every effort is directed to reducing the cell size. It can be shown that the memory cell size can be estimated by the formula:

Cell Area=$2\times(AP+2\delta)\times WP/AE$

Wherein:

AP=Active Pitch;

δ=Spacing of a bit line contact to the word line due to alignment limitations of photolithography (alignment errors);

WP=Word Line Pitch; and

AE=Area Efficiency.

In the produce and process of this invention, AE can be greater than previously known configurations, being above 80% and as high as about 100%.

Prior art approaches have focused on reducing the Cell Area by scaling but have reached limits in size reduction and tolerances due to the limits of photolithography, process techniques, and the need to make a capacitors having capacities greater than 25 fF. Similar constraints have limited the Area Efficiency for a typical 16 M DRAM to less than 80 percent.

OBJECTS AND SUMMARY OF THE INVENTION

It is an object of the present invention to provide a process for manufacturing a semiconductor device which provides component widths and spacings of in a range down to 1000 Å and smaller in horizontal planes by using the existing optical stepper or other advanced conventional lithographic exposure systems and even smaller dimensions in a range down to 700 Å using more advanced X-ray and more precise RIE techniques.

It is another object of this invention to provide a smaller DRAM cell structure which provides a theoretical efficiency of 100 percent.

It is a still further object of this invention to enable the construction of DRAMs having a density of up to four gigabits per device without sacrificing the cell capacity.

A further object of this invention is the provision of a DRAM having components which are entirely constructed in straight line structures, avoiding stress points, and yielding a more stable, low leakage product.

It is a still further object of this invention to provide a DRAM having word and active line arrays each of which are straight, have a uniform width, and have a uniform, minimum spacing from adjacent members of their respective arrays, the word and bit lines being in a configuration perpendicular to each other. In summary, one process of this invention is to produce a desired width of a product material in small dimensions in a range down to 800 Å. The process comprises the following steps:

a) depositing a form material on the surface of a product material;

b) removing a portion of the form material by vertical etching using photolithography to leave a sidewall of said form material;

c) depositing a layer of masking material over the form material and product material, the layer of masking material having a thickness correlating to said desired width of product material;

d) removing masking material by vertical RIE until the form material is exposed, leaving a predetermined width of masking material, and removing the form material until the underlying product material is exposed;

e) removing portions of the product material which are not protected by the masking material to leave a desired width of product material corresponding to the width of the masking material; and f) removing the masking material, leaving a desired width of said product material.

The form material can be nitride, the masking material can be oxide, and the product material is a conductor such as doped polysilicon. Examples of suitable products formed by this process are word lines and capacitor plates.

Another process of this invention forms a small spacing d between widths of material. This can be useful for reducing spacings between capacitor plates, conductors or transistors, and in reducing the size of field oxide areas, for example. It can also yield products such as bit lines or word lines with reduced widths. The process for forming a desired space between adjacent portions of a product material having a width e comprises the following steps:

a) depositing a form material on the surface of a product material;

b) removing a center portion of the form material by vertical etching using photolithography to leave form materials having widths W with opposed sidewalls spaced apart by a distance D which is greater than the desired spacing d by $2\Delta$;

c) depositing a layer of masking material over the form material and product material, the layer of masking material having a thickness correlating to $\Delta$;

d) removing masking material by vertical RIE until the form material is exposed, leaving $\Delta$ widths of masking material contacting each of the opposed sidewalls of the form material;

e) removing form material by etching;

e) removing portions of the product material which are not protected by the masking material; and f) removing the form material and the masking material, leaving adjacent pairs of adjacent widths of product material, each having a width e of in a range down to 800 Å, the desired spacing d between adjacent pairs of product material being in a range down to 700 Å; and a spacing W between adjacent widths of a product material.

In this process, each of the form material, masking material and product material is a member independently selected from the group consisting of nitride, oxide, conductor and laminate combinations thereof. Preferably, the form material and the masking material are not the same member, and the masking material and the product material are not the same member. For example, the form material include nitride, oxide, or combinations thereof; the masking material can be oxide; and the product material can be doped polysilicon or metal.

In one embodiment, the form material is nitride, the masking material is oxide, and the product material is a conductor. The product material can doped polysilicon.

The adjacent widths of product material can be word lines capacitor plates, for example.

Another embodiment of the process of this invention forms a desired spacing d in small dimensions in a range down to 700 Å between adjacent widths of a product material. It comprises the following steps:

a) depositing a form material on the surface of a product material;

b) forming an array of photolithographic masking materials spaced apart by a distance D;

c) removing portions of the form material by vertical etching to leave an array of form materials with opposed sidewalls spaced apart by a distance D which is greater than spacing d by $2\Delta$ and removing the photolithographic masking materials;

c) depositing a layer of second masking material over the form material and product material, the layer of second masking material having a thickness correlating to $\Delta$;

d) removing second masking material by vertical RIE until the form material is exposed, leaving $\Delta$ widths of opposed second masking material contacting each of the opposed sidewalls of the form material, the distance between the opposed widths of second masking material being in a range in a range down to 700 Å.

In one embodiment of this process, the form material, masking material and product material are each individually selected from the group consisting of nitride, oxide, conductor and laminate combinations thereof. Preferably, the form material and the masking material are not the same member and the masking material and the product material are not the same member.

In another embodiment of the process, the form material, masking material and product material are each individually selected from the group consisting of nitride, oxide, conductor and laminate combinations thereof, but the form material and the masking material are not the same member.

The process can be followed by the step of removing portions of the product material which are not protected by the masking material by RIE, and optionally, all or only part of the product material not protected by the masking material can be removed.

The process can be followed by an alternative steps of removing the product material by RIE, and removing the form material and the masking material by etching, leaving the product material widths separated by the desired space d.

In one embodiment, the product material is a layer of nitride supported by a silicon substrate and the masking material is polysilicon.

The process can be followed by the following additional steps:

oxidizing the exposed surfaces to effect oxidation of the polysilicon and the underlying substrate silicon; and removing the form material and polysilicon to leave a silicon substrate having field oxide portions with widths in a range down to 1000 Å.

The products of this invention includes memory having a plurality of linear straight word lines which have a uniform relative spacing and width; a plurality of active spaces which are linear, straight and have a uniform width and spacing; and combinations thereof. The product can be a stacked capacitor DRAM device.

Another memory device of this invention has a plurality of linear straight bit lines; a plurality of linear straight word lines which have a uniform relative spacing and width; a plurality of active spaces which are linear, straight and have a uniform width and spacing, or any combinations of any two or three thereof. The products can be a stacked capacitor DRAM device.

Another memory device of this invention has active area contacts which are isolated from adjacent active area contacts by non-conducting layers, the active area contacts having small widths of in a range down to 700 Å. A conductive landing pad layer contacts each of the active area contacts and overlaps a portion of the adjacent non-conducting layer, thereby enlarging the effective surface area of each area contact. Such a memory device can also include a parallel array of word lines extending in a direction, wherein the active area contact is a bit line contact, and the landing pad extends from the active area to a position displaced therefrom in said direction. Such a device can a stacked capacitor DRAM device.

Another process of this invention forms a cup-shaped capacitor plate for a stacked capacitor memory device. The process comprises the following steps:
   a) depositing a conductive layer in electrical contact with an active capacitor contact area of a substrate;
   b) depositing a upper layer of nitride, oxide or combination thereof on the surface of the conductive layer;
   c) forming a mask on the surface of the upper layer, the outer boundary of the mask positioned to define the inner walls of the capacitor;
   d) removing the upper layer and optional portions of the conductive layer by RIE to a depth which correlates to the sidewall thickness of the capacitor and removing the mask;
   e) depositing a layer of oxide material on the surface obtained in step (d);
   f) removing oxide by RIE until oxide is removed from the upper layer, leaving a shoulder of mask oxide on the surface of the upper layer and the conductive layer;
   g) removing the upper layer by etching and removing portions of the conductive layer which are not covered by the shoulder of mask oxide by RIE, leaving the sidewalls and floor of the capacitor;
   h) removing mask oxide by etching to leave a cup-shaped capacitor plate;
   I) depositing a layer of dielectric on the surface of the capacitor plate; and
   j) forming a conductive layer on the layer of dielectric to form a capacitor.

In this process, a portion of the conductive layer can be supported on a layer of support oxide, and step (h) can comprise comprises mask oxide and support oxide by etching to leave a cup-shaped capacitor plate, at least a portion of the underside of the floor thereof being available for capacitor surface. In this process, the width of the shoulder of mask oxide can be in a range down to 700 Å, for example.

A still further process of this invention is an array of transistors. It comprises the following steps
   a) depositing a layer of gate material on a layer of gate oxide supported by active silicon substrate;
   b) depositing an upper layer comprising nitride or oxide or combinations thereof on the gate material;
   c) forming an array of photolithography masked areas defining spaces between adjacent transistor gates on the upper layer, the distances between adjacent masked areas is D;
   d) removing the upper layer not covered by the masking areas by RIE and removing the photoresist;
   e) depositing mask oxide on the upper surface obtained in step (d);
   f) removing mask oxide by RIE, leaving shoulders of oxide mask adjacent the upper layer having a thickness Δ;
   g) removing upper layer by etching and removing gate material by RIE to leave an array of mask oxide protected gates;
   h) removing mask oxide by etching, leaving an array of gates with width e.

In this process, the silicon substrate between adjacent gates formed in step (g) can be weakly doped by ion implantation and can be followed by the following additional steps:
   i) a layer of masking oxide is deposited on the product of step (h);
   j) masking oxide is removed by RIE to leave shoulders of mask oxide adjacent the gates and exposed areas of active substrate between the shoulders; and
   k) exposed areas of active substrate are doped by ion implantation.

A still further process of this invention smaller, precise field oxide in a semiconductor device. It comprises the following steps:
   a) depositing successive pad oxide, polysilicon and upper nitride layers on a silicon substrate;
   b) forming resist mask portions on the nitride layer by photolithography to define the field oxide area and portions of the nitride to remain and removing the areas of nitride and a partial polysilicon unprotected by the mask portions by RIE, and removing the resist mask portions;
   c) depositing a masking layer of polysilicon on the upper surfaces of the product of step (b);
   d) removing the masking polysilicon by RIE to leave shoulders of mask polysilicon and exposed areas of nitride between the shoulders;
   e) exposing the product of step (d) to oxidation to grow field oxide in the exposed areas of pad oxide.

Other features and advantages of the invention will be apparent from the following description taken in connection with the accompanying drawings.

BRIEF DESCRIPTION OF THE DRAWINGS

FIG. 8A is a top view showing the relative shapes and positions of the superimposed layers after formation of the holes to the storage capacitor landing pads.

DETAILED DESCRIPTION OF THE INVENTION

Certain terms used herein are abbreviated terms in the art. Unless otherwise specified, "oxide" means silicon dioxide; "nitride" means silicon nitride; polysilicon means polycrystalline or amorphous silicon; "BOE" means buffered oxide etching solution (containing ammonium fluoride and hydrofluoric acid; "RIE" means conventional vertical reactive ion etching process or anisotropic plasma etching; "polycide" means a composite of polysilicon and a refractory metal such as molybdenum, platinum, silicide, titanium silicide or tungsten silicide, for example; "conductor" means a conductive material which can be doped polysilicon, polycide, refractory or non-refractory metal and the like; and "HTO" means CVD deposited silicon dioxide at high temperatures.

Figure 1:
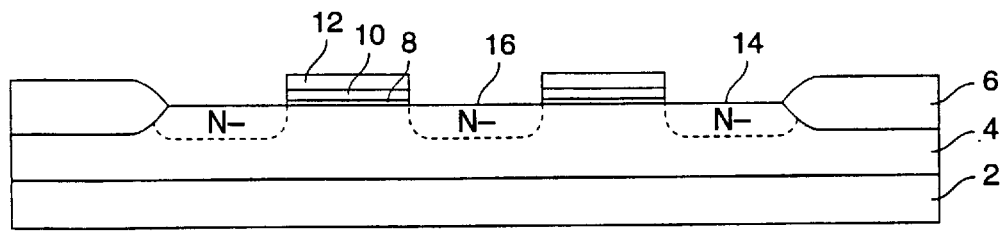
FIG. 1 is a schematic cross-sectional representation of an intermediate in the process after the formation of the word line gates.
Figure 1A:
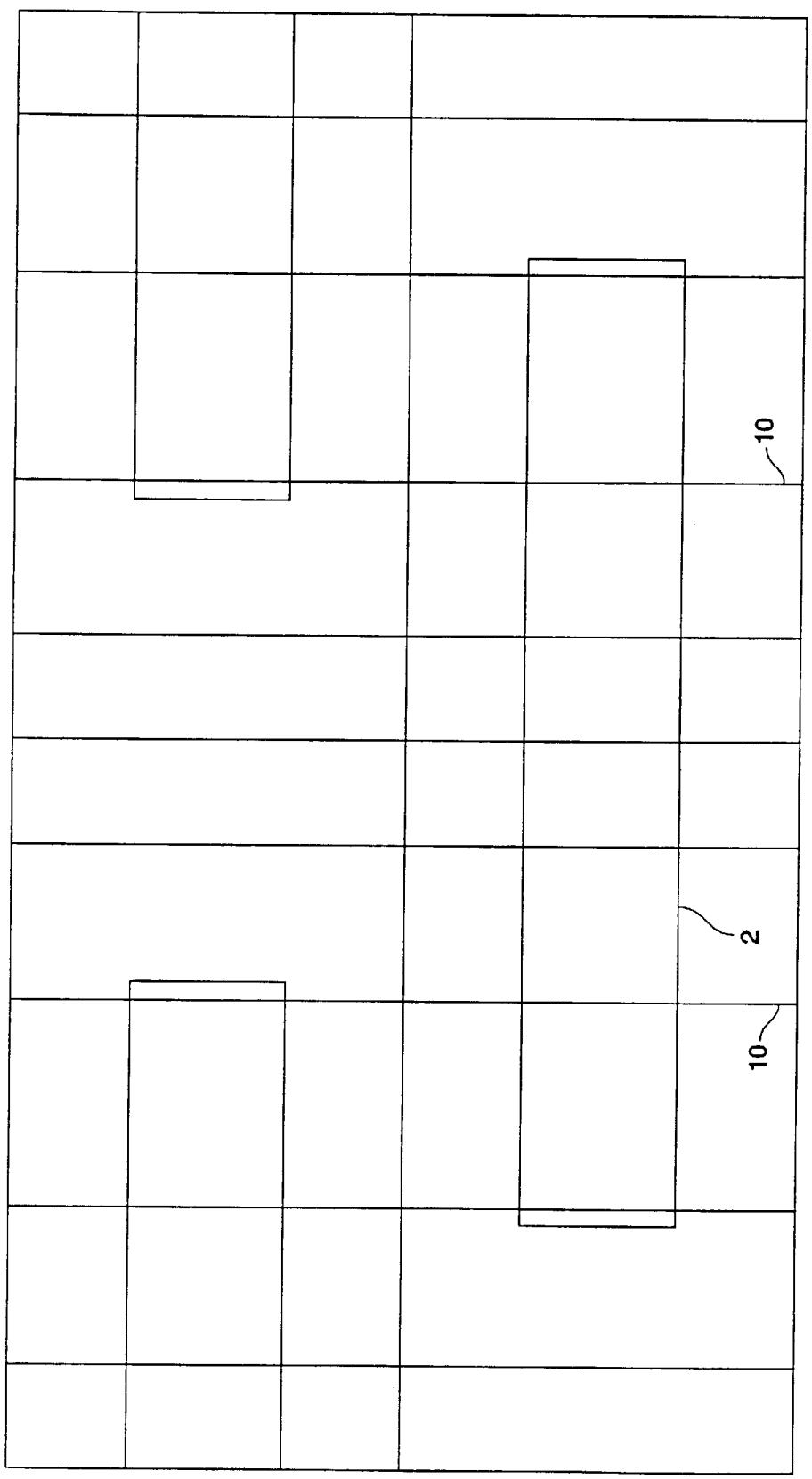
FIG. 1A is a top view of the representation in FIG. 1, showing the relative shapes and positions of the superimposed layers.

FIG. 1 is a schematic cross-sectional representation of an intermediate in the process after the formation of the word line gates. FIG. 1A is a top view of the representation in FIG. 1, showing the relative shapes and positions of the superimposed layers. These early steps are conventional procedures, known in the art, portions of which are described in U.S. Pat. No. 5,114,873, for example, the entire contents of which are hereby incorporated by reference. This intermediate is prepared by the following steps. An N or P type semiconductor substrate 2 is weakly doped with either a P type impurity such as boron or an N type impurity such as phosphorus, arsenic or antimony to form the corresponding P-well or N-well 4. In the process described hereinafter, an P-well is formed by weakly doping the substrate with boron in P type semiconductor substrate for purposes of illustration and example, not by way of limitation.

A pad oxide layer is grown on the surface of a silicon substrate and covered with a layer 0 Å to 1000 Å of polysilicon, and a layer of nitride is deposited thereon. Using conventional lithography, a mask of photoresist material is deposited on the surface, developed, the nitride layer is removed from the field oxide region, and the photoresist is removed. The field oxide regions 6 are then grown to isolate the cell. The nitride, polysilicon and oxide are then removed to expose the silicon channel. The channel is doped using conventional ion implantation with a conventional photolithography mask.

A layer of gate oxide 8 having a thickness of from 40 Å to 200 Å is grown on the surface, and a layer of gate material 10 is deposited thereon. Suitable gate materials are doped polysilicon, polycide or combinations thereof. On this surface, a layer 12 of 0 Å to 2500 Å of oxide is deposited. Using conventional lithographic techniques, the exposed oxide layer is removed by RIE. The exposed polysilicon is removed by RIE etching, leaving the word line conductive gate layers 10. The exposed N− channels are subjected to light ion implantation with N− dopants such as phosphorous, arsenic or antimony, for example, and the P− channels are subjected to light ion implantation with P− dopant, boron or boron difluoride.

Figure 2:
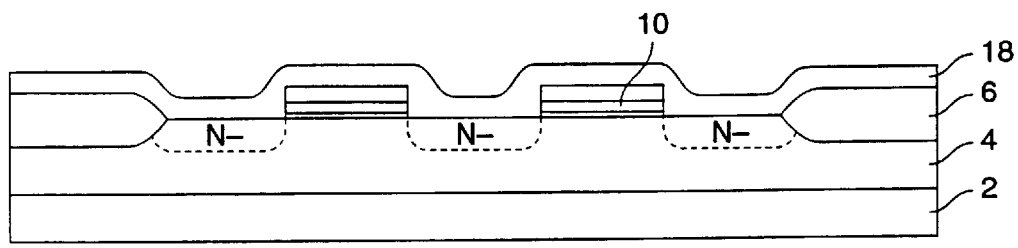
FIG. 2 is a schematic cross-sectional view of the product in FIG. 1 after deposition of a layer of oxide.

FIG. 2 is a schematic cross-sectional view of the product in FIG. 1 after deposition of a 1000 Å to 1500 Å layer of oxide 18 on the surface.

Figure 3:
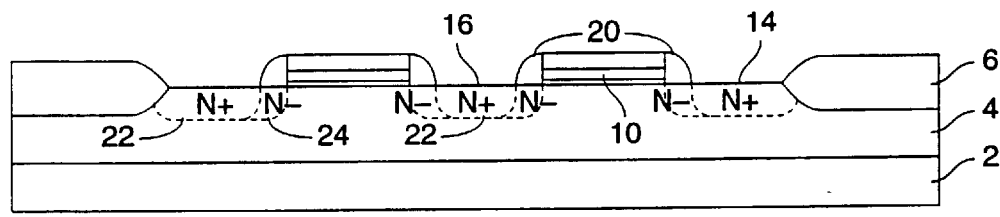
FIG. 3 is a schematic cross-sectional view of the product in FIG. 2 after RIE to expose the channels and ion implantation of the channels.

FIG. 3 is a schematic cross-sectional view of the product in FIG. 2 after ion implantation by the following process. N+ channels are subjected by ion implantation with N+ dopants, phosphorous, arsenic or antimony, for example, and the P+ channels are subjected to P+ dopant implantation with boron or boron difluoride, for example. The oxide spacers 20 prevent encroachment of the implanted areas 22 on the substrate underlying the word lines and leave N− doping areas 24.

Figure 4:
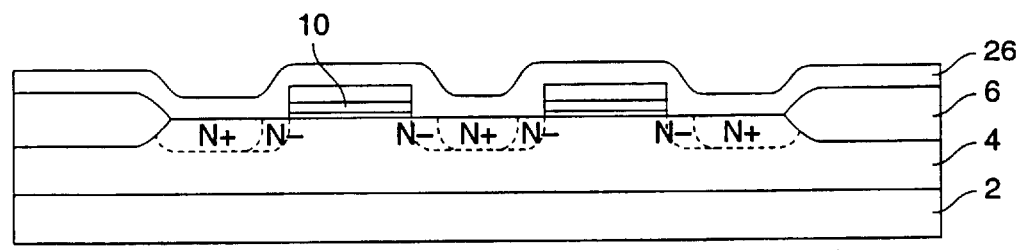
FIG. 4 is a schematic cross-sectional representation of the product in FIG. 3 after deposition of a layer of oxide.

FIG. 4 is a schematic cross-sectional representation of the product in FIG. 3 after deposition of a layer of oxide 26.

Figure 5:
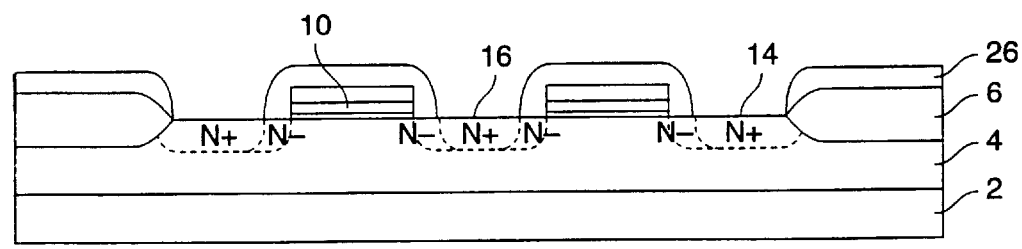
FIG. 5 is a schematic cross-sectional representation of the product of FIG. 4 after RIE to expose the landing pad contact areas.

FIG. 5 is a schematic cross-sectional representation of the product of FIG. 4 after removal of the oxide covering the landing pad contacts areas 14 and 16 by conventional photolithography and RIE.

Figure 6:
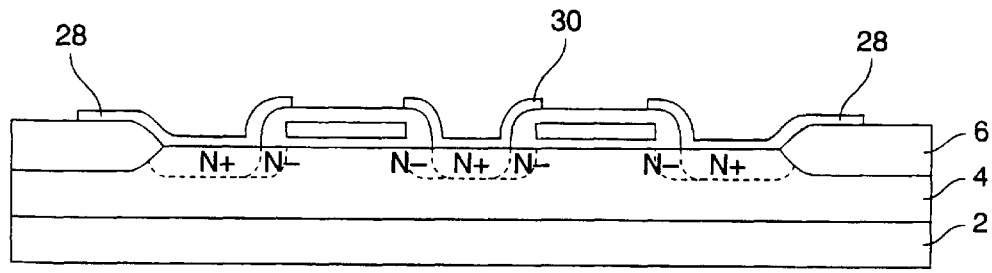
FIG. 6 is a schematic cross-sectional representation of the product of FIG. 4 after formation of the conductive landing pads on the channels.
Figure 6A:
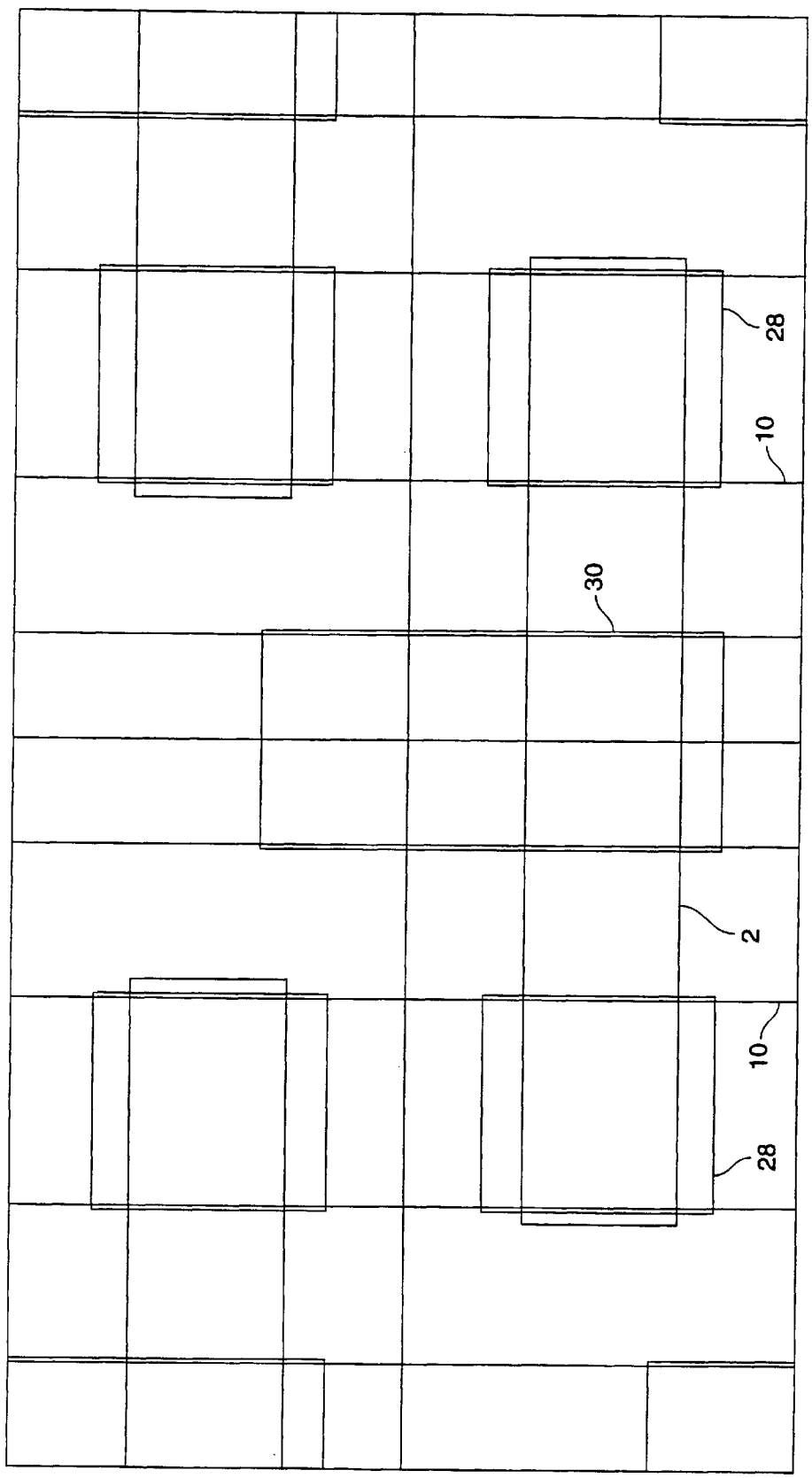
FIG. 6A is a top view of the representation in FIG. 6, showing the relative shapes and positions of the superimposed layers, including the landing pads.

FIG. 6 is a cross-sectional representation of a further intermediate in the process of this invention after formation of the landing pads 28 and 30 according to the following process. Referring to FIG. 6, a layer of from 1000 Å to 2500 Å of polysilicon is deposited over the surface, and the polysilicon can be doped during or after deposition. Using conventional photolithography techniques, portions which are not covered by photoresist are removed by etching to leave separated polysilicon capacitor landing pads 28 and bit line landing pad 30. FIG. 6A is a top view of the representation in FIG. 6, showing the relative shapes and positions of the superimposed layers.

Figure 7:
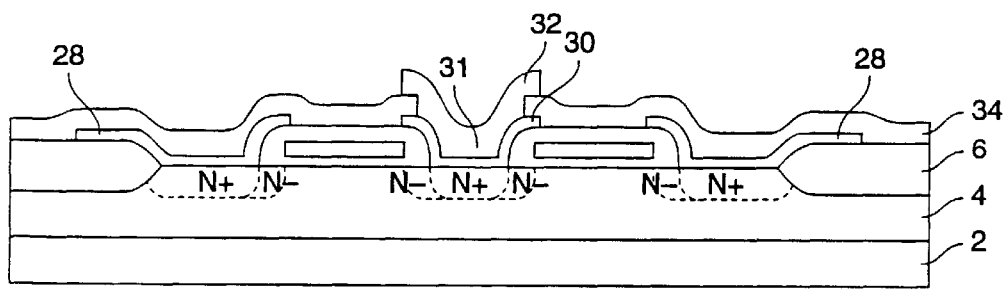
FIG. 7 is a cross-sectional representation of a further intermediate in the process of this invention after formation of the bit line.

FIG. 7 is a cross-sectional representation of a further intermediate in the process of this invention after formation of the bit line 32 according to the following procedure.

Figure 7B:
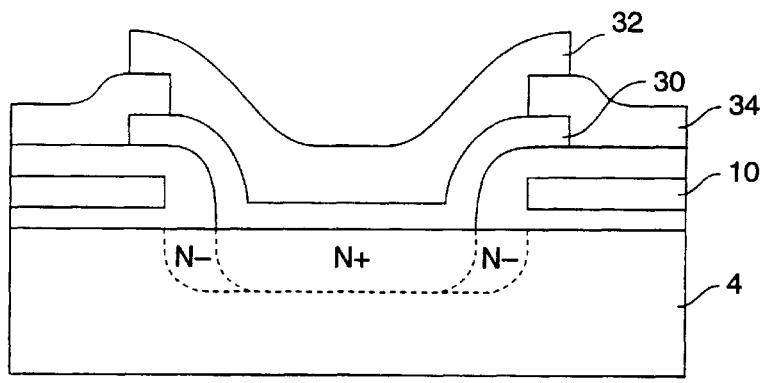
FIG. 7B is an enlarged schematic view of the bit line structure shown in FIG. 7.
Figure 7A:
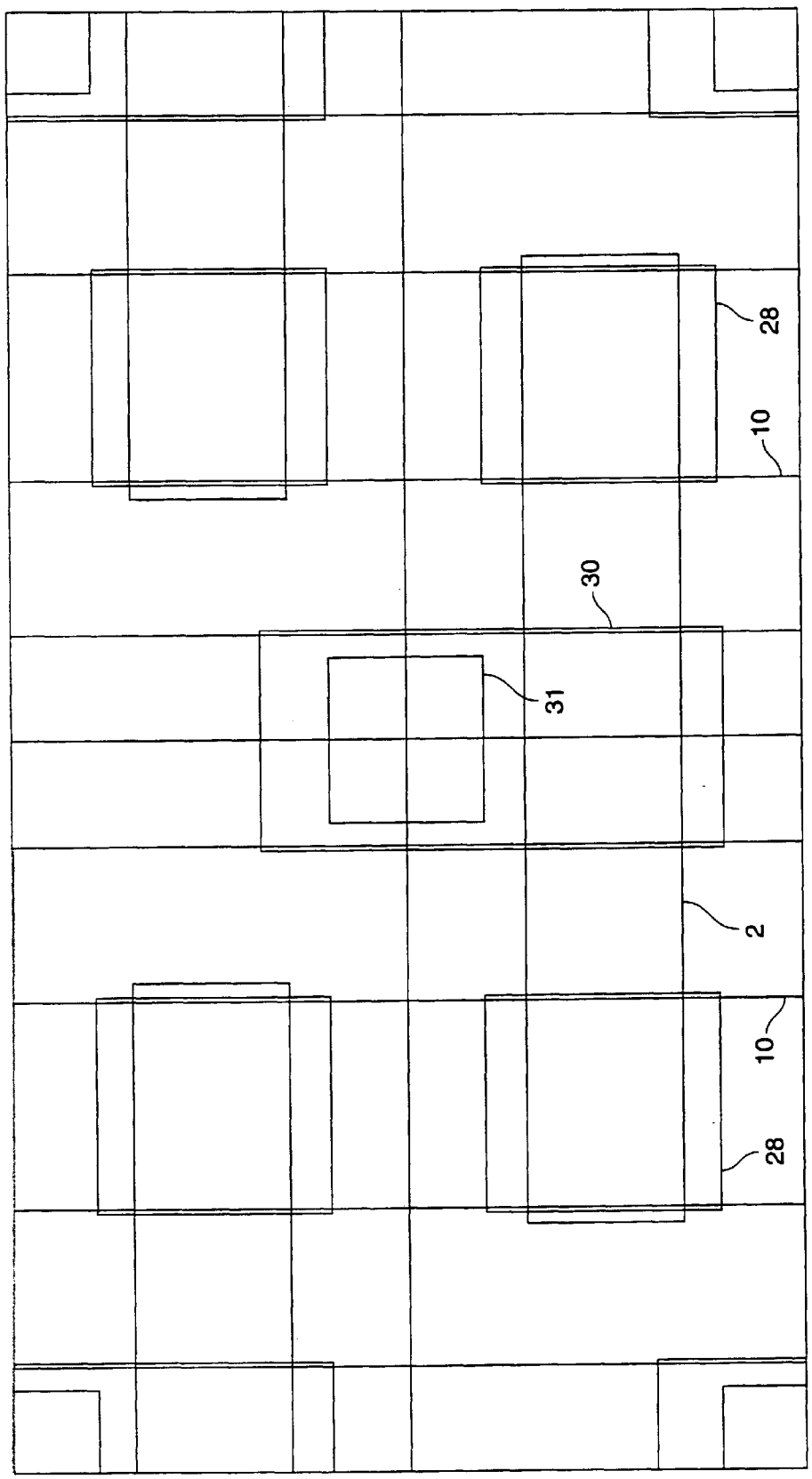
FIG. 7A is top view of the product after exposing the bit line contact, showing the relative shapes and positions of the superimposed layers.
Figure 7C:
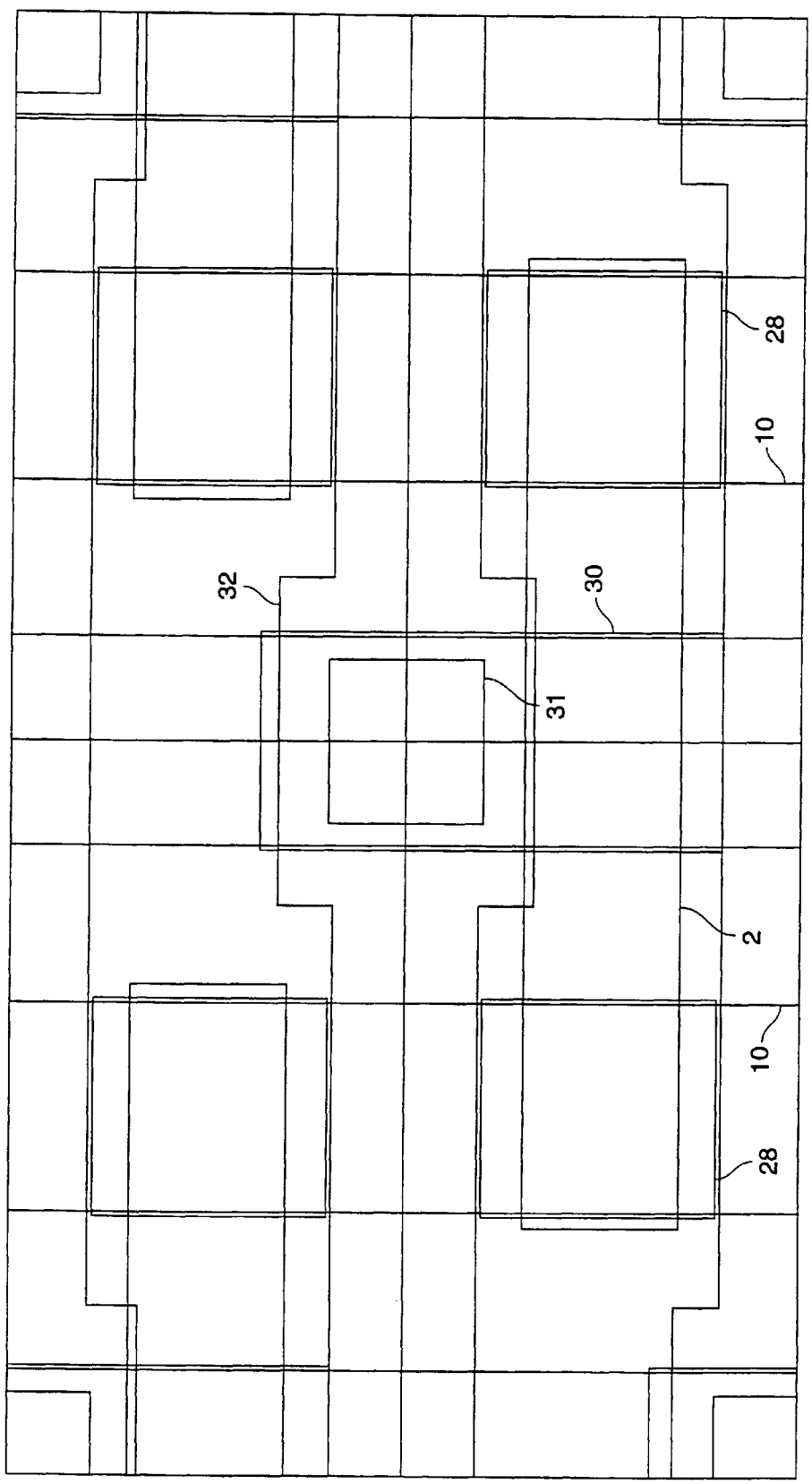
FIG. 7C is a top view of the product after formation of the bit line, showing the relative shapes and positions of the superimposed layers.

Referring to FIG. 7, a 1000 Å to 3500 Å layer of oxide 34 is deposited over the entire surface obtained in FIG. 6. Using conventional photolithography, a portion of the oxide layer covering the bit line landing pad 16 is removed by RIE to form a bit line contact 31. FIG. 7A is top view of the product after exposing the bit line contact, showing the relative shapes and positions of the superimposed layers. A conductive material such as doped polysilicon, polycide or metal is deposited on the surface and etched by conventional photolithography to leave a bit line 32 on extension of the bit line landing pad 30. FIG. 7B is an enlarged schematic view of the bit line structure shown in FIG. 7 showing the overlap of the bit line 32 with the edges of the oxide layer 34. FIG. 7C is a top view of the product after formation of the bit line, showing the relative shapes and positions of the superimposed layers.

Figure 8:
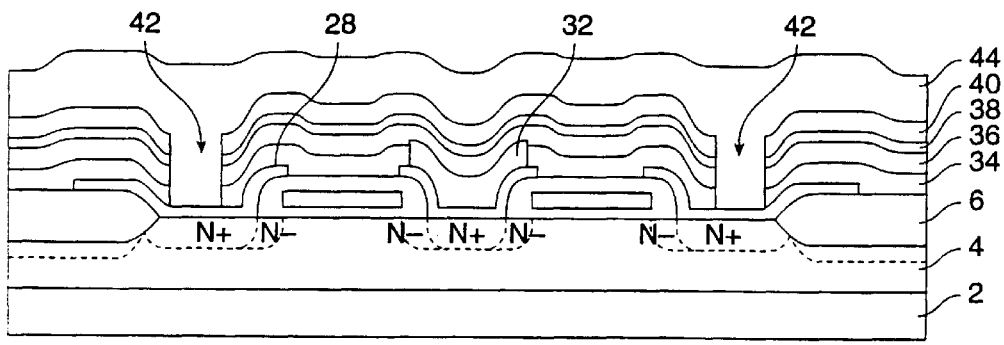
FIG. 8 is a cross-sectional representation of a further intermediate in the process of this invention after forming the storage contact and forming the polysilicon layer from which the capacitors are to be formed.

FIG. 8 is a cross-sectional representation of a further intermediate after formation of the polysilicon layer from which the capacitors are to be formed by the following process. Referring to FIG. 8, sequential layers are formed comprising a lower layer of about 1500 Å to 4000 Å of oxide 36, an intermediate layer of 100 Å to 500 Å of nitride 38, and an upper layer of 500 Å to 3000 Å of oxide 40 are deposited over the surface obtained in FIG. 7, isolating the bit line 32. Using conventional photolithography techniques, capacitor contact holes 42 are etched through the sequential layers to uncover the storage capacitor landing pads 28. A thick layer (3000 Å to 10,000 Å) of polysilicon 44 is then deposited over the entire surface and in the holes 40. The polysilicon can be doped during or after deposition. FIG. 8A is a top view showing the relative shapes and positions of the superimposed layers after formation of the holes to the storage capacitor landing pads.

FIGS. 9–13 are schematic cross-sectional representations showing steps in the process of this invention for preparing high precision, maximum surface area storage capacitors.

Figure 9:
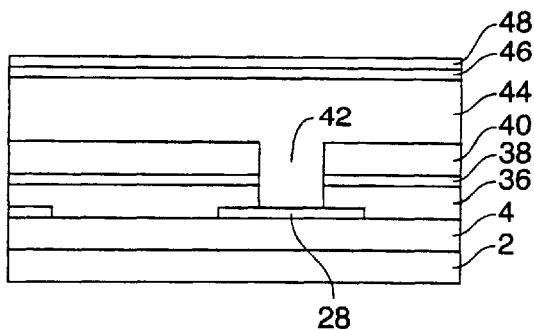
FIG. 9 is a schematic cross-sectional representation of a portion of the representation in FIG. 8 from which the storage capacitor is to be formed.

FIG. 9 is a schematic cross-sectional representation of a portion of the representation in FIG. 8 including the hole 42, layers 36, 38, 40 and polysilicon layer 44, the polysilicon layer 44 being in electrical contact with the landing pad 28. An optional thin oxide layer 46 (0 Å to 200 Å) and a nitride layer 48 (1000 Å to 3000 Å) are deposited on the surface of polysilicon layer 44.

Figure 10:
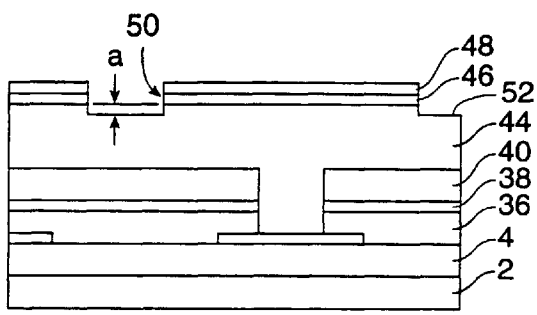
FIG. 10 is a schematic cross-sectional representation of the intermediate shown in FIG. 9 after the center form has been shaped by conventional photolithography procedures.

FIG. 10 is a schematic cross-sectional representation of the intermediate shown in FIG. 9 after the center form has been shaped by the following conventional photolithography procedures. Using a mask of photoresist material, the exposed areas of the nitride layer 48 and the oxide layer 46 are removed by conventional etching. An upper portion of the polysilicon layer 44 is optionally removed by RIE to form a sidewall 50 and optional shoulder 52 having a height "a" representing a reduction of polysilicon of 0 Å to 3000 Å. The photoresist is then removed.

Figure 11:
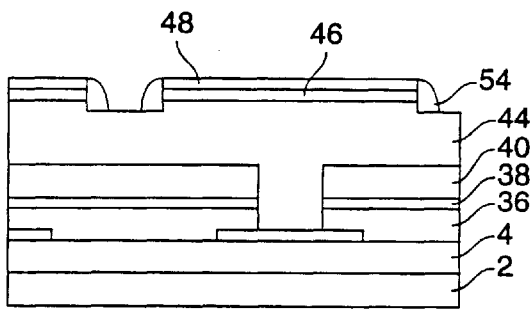
FIG. 11 is a schematic cross-sectional representation of the intermediate shown in FIG. 10, after formation of the oxide mask.

FIG. 11 is a schematic cross-sectional representation of the intermediate shown in FIG. 10, after formation of the oxide mask. This mask is formed by the following process. A layer of CVD oxide is deposited on the entire surface. This invention is based on the discovery that of a new procedure for increasing the precision of spacing and width in the horizontal plane and floor thickness, a procedure which is far more precise and yields far closer tolerances than the photolithography based procedures. The thickness of deposited layers can be controlled with high precision to uniform deposit thickness in a range down to 200 Å. We have discovered a procedure which translates the high precision coating thickness to equally precise horizontal widths or spaces.

Figure 11A:
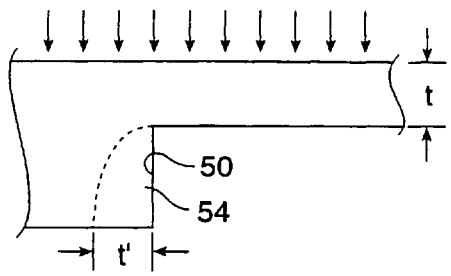
FIG. 11A is a schematic representation showing the dimensional relationship between the thickness of the mask forming material deposit and the width of the mask formed in the process of this invention.

Referring to FIG. 11A, when an oxide layer of thickness "t" is deposited on a surface, and the surface is etched by RIE, a shoulder 54 of oxide is formed. The width of the shoulder "t'" is a function the thickness t, is proportional to the thickness t and is approximately equal to 0.8 t. By controlling the thickness to a precise desired value, the shoulder width t' can be controlled to the same value and precision, an oxide coating thickness of 1000 Å to 2000 Å yielding a corresponding 800 Å to 1600 Å width in the shoulder 54 in FIG. 11. The shoulder 54 in FIG. 11 can then be used as a precision mask for etching. This formula fits the typical case where t is smaller than t', and it may not fit other cases where the RIE process is abbreviated or extended beyond the illustrated stage of etching and shoulder formation.

Figure 11B:
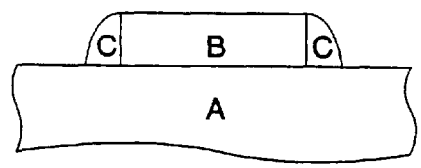
FIG. 11B is a schematic representation of the system of this invention for forming small widths of material.

FIG. 11B is a schematic representation of the system of this invention for forming small widths of material. The product material A can be metal, oxide, polysilicon, nitride or other selected material. B, the form material and C, the mask material each can be metal, oxide, polysilicon, nitride or other selected material so long as A and B are different and B and C are different, that is, have etching differentials which can provide the relative component functions during RIE or etching.

Figure 12:
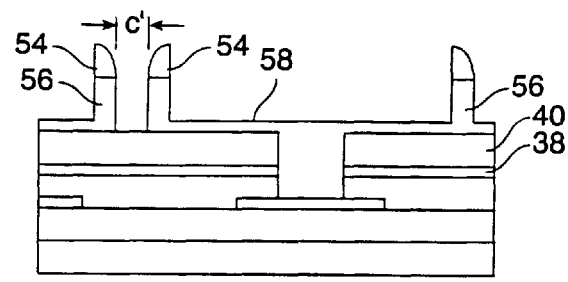
FIG. 12 is a schematic cross-sectional representation of the intermediate shown in FIG. 11 after removal of a portion of the polysilicon layer by vertical RIE.

FIG. 12 is a schematic cross-sectional representation of the intermediate shown in FIG. 11 after removal the outer portion of the polysilicon layer 44 by the following process. The nitride layer 48 and oxide layer 46 are removed by conventional wet or dry etching processes. Then, the exposed polysilicon is time etched by RIE, leaving the integral box or cup-shaped capacitor wall structure 56 and floor 58. The width of the walls 56 can be any selected width in a range down to about 700 Å, obtained by selecting an oxide thickness t which has the corresponding proportional thickness. Since the shoulder 52 is lower than the upper surface of the polysilicon layer 44, the shoulder portion 52 is removed before all of the central polysilicon, leaving a thin floor layer 58 remaining when the etch has reached the upper surface of the oxide layer 40. Alternatively, by increasing the RIE etching timie, the floor layer can be completely removed, if desired for a specific application.

It will be obvious to a person skilled in the art that by substituting other materials having contrasting etching resistance'ss and selection of respective etching solutions and gases, the polysilicon can be replaced by other conductors or semiconductors to yield a wall of said material. Alternatively, the materials could be reversed to yield a wall of a contrasting materials such as silicon dioxide, for example.

Figure 13:
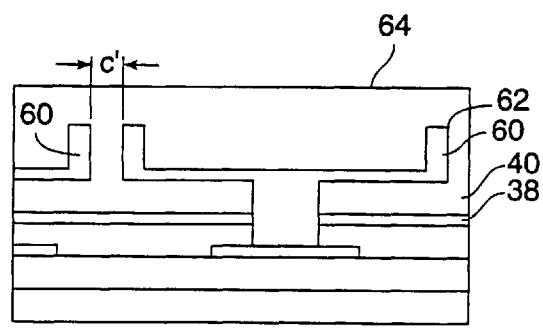
FIG. 13 is a schematic cross-sectional representation of the intermediate shown in FIG. 12 after deposition of the dielectric material and the conductive material from which the capacitor plate is to be formed.

FIG. 13 is a schematic cross-sectional representation of the intermediate shown in FIG. 12 after formation of the second capacitor plate by the following procedure. The oxide layer 40 and oxide mask 54 are removed by exposure of the surface to buffered oxide etch solution (BOE, HF and NH$_4$F), leaving the fully formed capacitor plate 60 with exposed upper and lower surfaces, the edges 62 remaining in a sharp, defined and non-eroded condition.

A thin dielectric insulating layer such as nitride, titanium oxide, oxide, or combination thereof is deposited on all exposed surfaces of plate 60. If nitride is used, any pinholes are closed by conventional oxide growth. The capacitor plate 60 with the dielectric insulating layer is then covered with from 1000 Å to 3500 Å of a conductor 64 such as doped polysilicon, polycide, metal or combinations thereof to form a complete capacitor.

Figure 14:
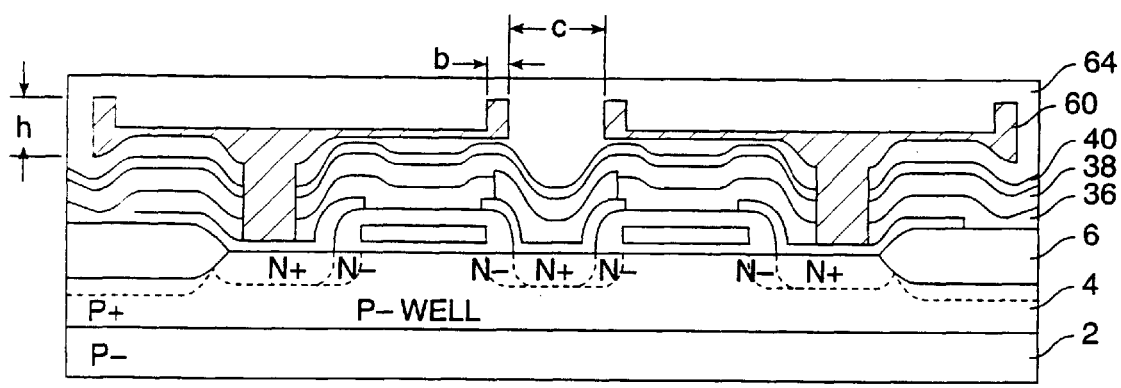
FIG. 14 is a schematic cross-sectional representation of the completed DRAM cell following the capacitor formation.

FIG. 14 is a schematic cross-sectional representation of the device following the capacitor formation. The entire side surfaces, upper and lower surfaces of the plate 60 are available as plate surfaces, providing sufficient capacitance per plate for size reductions down to sub-micron scales. Capacitance can be further increased by increasing the height "h" to any desired figure, permitting cell sizes or areas as low as $0.2\mu^2$ per cell. The width of the capacitor plate sidewall "e" can be in a range down to as low as 800 Å, and the spacings between adjacent capacitors "c'" can be as low as 1000 Å, permitting use of substantially all of the cell width as capacitor width.

Referring to FIGS. 12–14, the storage spacing distance c' is also determined by the essential steps of the process described with respect to FIGS. 15–22. The oxide shoulders 54 (FIGS. 11–12) for adjacent capacitor plates 60 (FIG. 13) determine the spacing between adjacent storage cell surfaces. The application of the process of this invention to obtain spacings d with sizes in a range down to 700 Å is described in greater detail with respect to FIGS. 15–22 hereinafter.

Figure 14A:
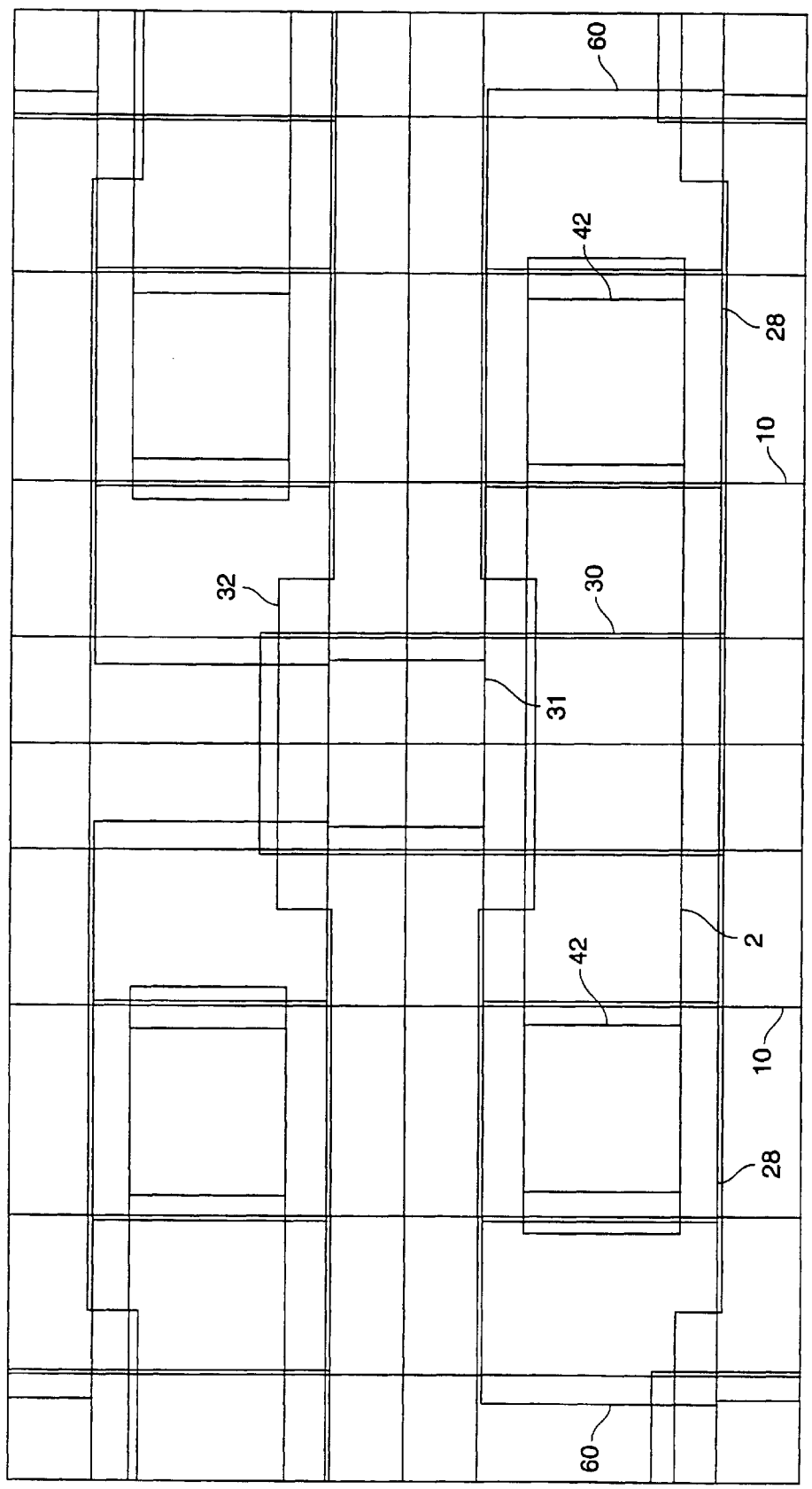
FIG. 14A is a top view showing the relative shapes and positions of the layers in the final device.

FIG. 14A is a top view showing the relative shapes and positions of the layers in the final device.

Referring to FIGS. 7B and 8A, the configuration for the device of this invention includes an array of primary bit lines 32 and an array of word lines 10, the primary bit lines 32 being oriented perpendicular to the word lines 10, and a landing pad 30 extending from each cell to a contact 31 for bit line 32 laterally displaced from the center of the cell. The entire upper surface of the cell is available for the capacitor. Together with the smaller capacitor cell walls and distances between adjacent cells, this configuration has a theoretical area efficiency of 100 percent, making available a product having a previously unattainable number of cells per chip. DRAMs of this construction have a density of greater than 1 megabit and can be up to four gigabits.

It will be readily apparent to a person skilled in the art that the novel process techniques of this invention can be applied to reduce the cell size, and in return, reduce the chip size and increase the area efficiency of other semiconductor devices such as SRAM, ROM, Flash E$^2$PROM, and N-channel or P-channel FET devices.

Figure 15:
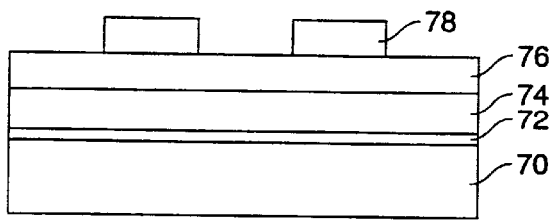
FIGS. 15–24 are schematic representations of the process of this invention for preparing word gate structures which have smaller widths and spacings and for preparing small spacings in a range down to 700 Å.

FIG. 15 is a schematic cross-sectional representation of an initial multilayer structure comprising silicon substrate layer 70; thin gate oxide layer 72; conductive word line material 74 such as doped polysilicon, a refractory metal such as tungsten, polycide or combinations thereof; nitride, oxide or combinations thereof 76; and photoresist mask portions 78, all prepared by conventional procedures.

Figure 16:
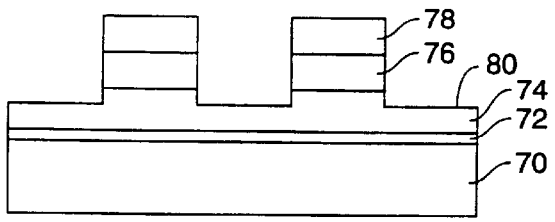

FIG. 16 is a schematic cross-sectional representation of the product of FIG. 15 following removal of exposed nitride or oxide 76, and optionally, a portion of the word line material 74 by conventional vertical RIE procedures, leaving optional shoulder 80.

Figure 17:
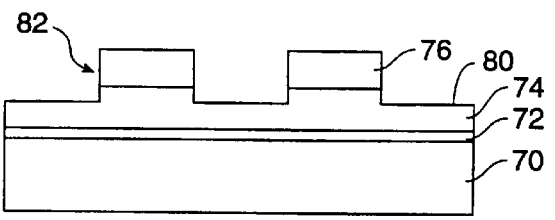

FIG. 17 is a schematic cross-sectional representation of the product of FIG. 16 following removal of the mask portions 78 by conventional procedures, leaving the nitride 76 and critical side walls 82 for formation of an oxide word line mask.

Figure 18:
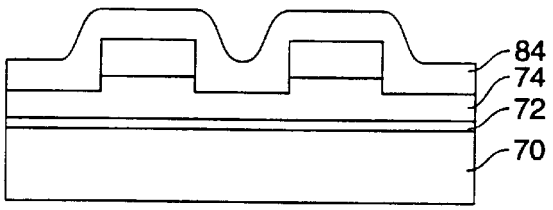

FIG. 18 is a schematic cross-sectional representation of the product of FIG. 17 following deposit of mask oxide layer 84 in a thickness which corresponds to the desired width of the word line, using the principals and relationship described above with respect to FIG. 11A.

Figure 19:
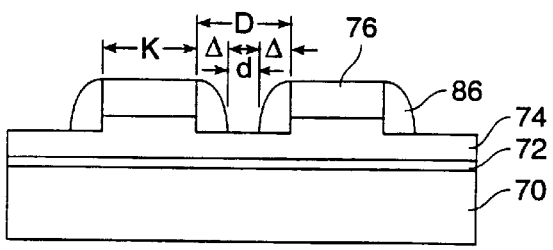

FIG. 19 is a schematic cross-sectional representation of the product of FIG. 18 following removal of the layer by RIE, leaving the oxide masks 86.

Figure 19A:
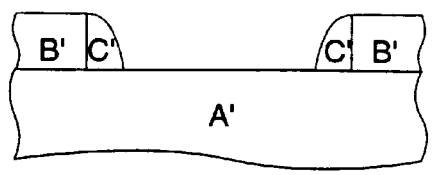

FIG. 19A is a schematic representation showing the intermediate process of this invention for preparing small spaces in product materials after forming the shoulder having width A as shown in FIG. 11A, product material is etched, and the nitride and mask layer is removed. A' can be any desired product material such as a metal, oxide, polysilicon, nitride or the like. B', the form material and C', the masking material can be metal, oxide, polysilicon, nitride or the like, and contrary to the small width relationships described above with respect to FIG. 11B, the form materials B' and mask materials C' can be the same since they do not require differential etching rates.

Figure 20:
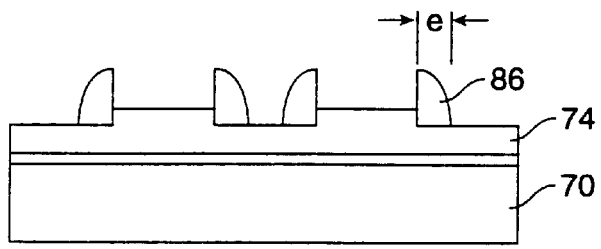

FIG. 20 is a schematic cross-sectional representation of the product of FIG. 19 following removal of the nitride layer 76 by conventional wet or dry etching procedures.

Figure 21:
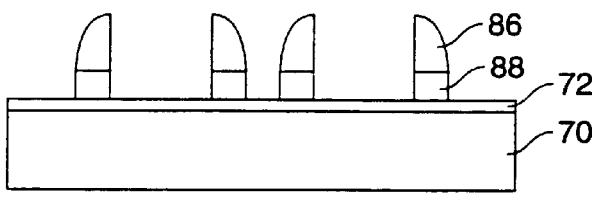

FIG. 21 is a schematic cross-sectional representation of the product of FIG. 20 following conventional vertical RIE of the exposed gate material 74, forming the word lines 88.

Figure 22:
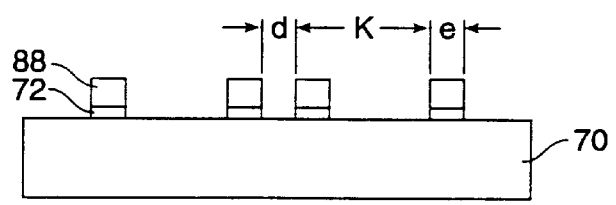

FIG. 22 is a schematic cross-sectional representation of the product of FIG. 21 following removal of the oxide masks 86 and exposed portions of the gate oxide layer 72 by conventional BOE processes. The product is then processed according to the procedures described hereinabove to manufacture the finished memory device.

Figure 23:
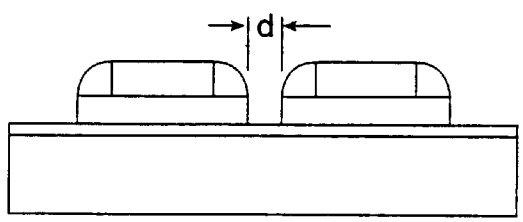
Figure 24:
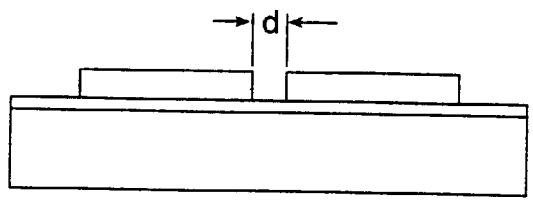

FIGS. 23 and 24 are schematic cross-sectional representations of an alternative product which can be prepared from the intermediate shown in FIG. 19. The representation in FIG. 23 is obtained following vertical RIE of the exposed product material 74 without removing the nitride layer 76. The product in FIG. 24 is obtained after removal of the nitride and oxide by conventional etching processes.

Referring to FIG. 19, the desired spacing d between word lines 88 can be represented by the equation:

$$d=D-2\Delta$$

For example D can be as low as $0.4\mu$ using advanced, conventional lithography such as the currently available optical steppers. $\Delta$ can be as $0.15\mu$ or lower, determined by the thickness of layer 84 (FIG. 18) after forming the shoulder having width $\Delta$ as shown in FIG. 11A, gate material is etched, and the nitride and mask layer is removed. The resulting d is $0.1\mu$ or 1000 Å.

The process of this invention can also be used to grow precisely defined and smaller areas of field oxide.

Figure 25:
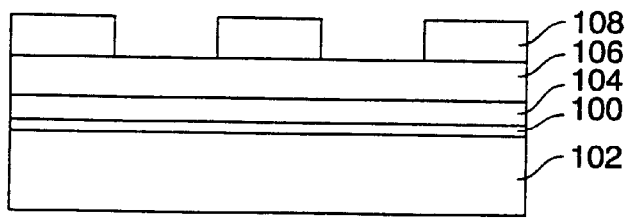
FIGS. 25–34 are schematic representations of the process of this invention for preparing small spacings in a range down to 700 Å and which can yield smaller, precision field oxide areas.

FIG. 25 is a schematic representation of a section of a memory device formed by the following procedure. A layer of pad oxide 100 having a thickness of 50 Å to 250 Å is deposited or grown on a silicon substrate 102. A layer of polysilicon 104 having a thickness of from 0 Å to 1000 Å and a layer of nitride 106 having a thickness of 1000 Å to 2000 Å is deposited on the pad oxide 100. A mask 108 is formed by conventional lithography.

Figure 26:
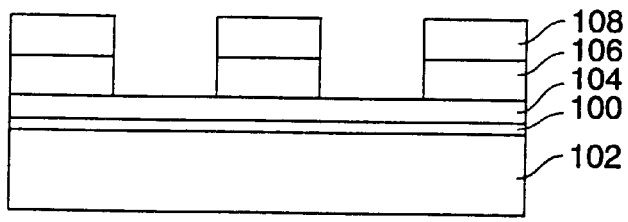

FIG. 26 is a schematic representation of the component of FIG. 25 following the removal of the nitride in the opening of the mask portions 108 by conventional procedures.

Figure 27:
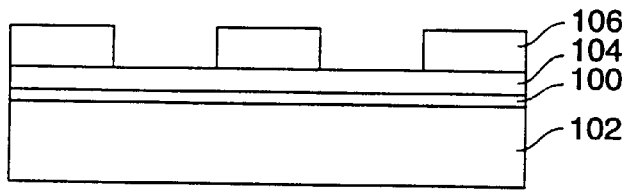

FIG. 27 is a schematic representation of the component of FIG. 26 following removal of portions of polysilicon 104 which are not protected by the nitride portions 106 by RIE partially and removal of the photoresist.

Figure 28:
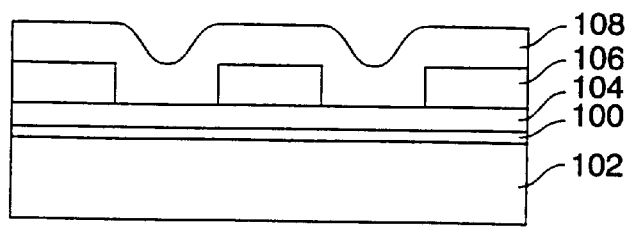

FIG. 28 is a schematic representation of the component of FIG. 27 following deposition of a layer of polysilicon correlating to the desired thickness of the shoulder 110 (FIG. 29) as described hereinabove with respect to FIG. 11A.

Figure 29:
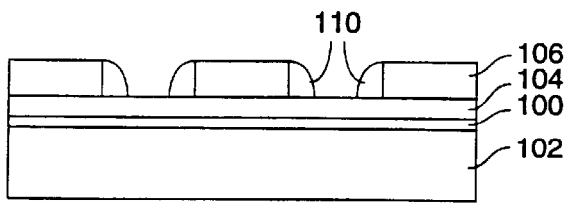

FIG. 29 is a schematic representation of the component of FIG. 28 following removal of polysilicon 108 by RIE until the surface of the nitride 106 is exposed, leaving the mask shoulders 110 between the nitride form material 106.

Figure 30:
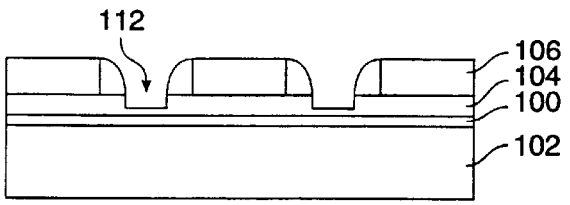

FIG. 30 is a schematic representation of the component of FIG. 28 following removal of polysilicon 108 by RIE and optional removal of a portion of the polysilicon 104 by RIE to form a channel with a thinned polysilicon portion 112 at the bottom thereof.

Figure 31:
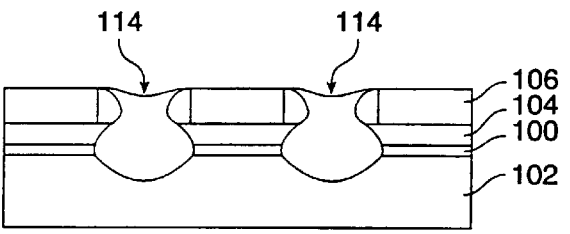
Figure 32:
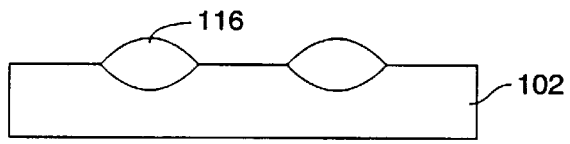

FIG. 31 is a schematic representation of the component of FIG. 27 or FIG. 28 following oxidation of the polysilicon surfaces exposed in the channel, the thinned bottom portion 112 and a portion of the underlying silicon 102 to form a silicon oxide 114.

FIG. 30 is a schematic representation of the component of FIG. 29 following removal of all of the nitride 106 and any remaining polysilicon, yielding a substrate 102 with spaced field oxide portions 116.

Figure 33:
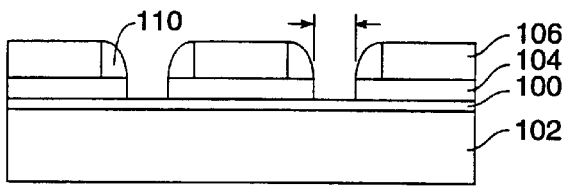
Figure 34:
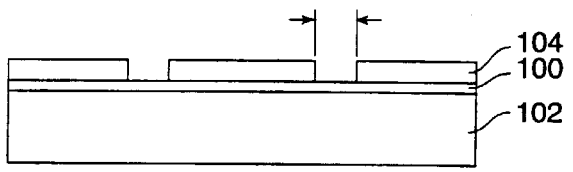

FIGS. 33 and 34 are schematic cross-sectional representations of an alternative product which can be prepared from the intermediate shown in FIG. 28. The representation in FIG. 33 is obtained following vertical RIE of the exposed masking material 108 and then polysilicon 104 until the pad oxide layer 100 is reached, without removal of the nitride 104. The product in FIG. 34 is obtained after removal of the nitride and oxide by conventional etching processes.

With the process of this invention, the spacings between the opposed shoulders 110 can be in a range down to 700 Å, yielding accurately sized field oxide portions 116 with widths which are in a size range of down to 1000 Å.

As described above with respect to the manufacture of the capacitor structure, the process of this invention yields far smaller widths, spaces, simultaneously, with conventional lithographic, deposition and etching procedures than can be achieved by previously known processes. The spacings between word lines "d" and the widths "e" can be as small as 700 Å or smaller, yielding memory devices with cell sizes as low as $0.2\mu^2$ and lower.

Obviously, numerous modifications and variations of the present invention are possible in light of the above teachings. It is therefore to be understood that within the scope of the appended claims, the invention may be practiced otherwise than as specifically described herein.

The invention claimed is:

1. A process for forming a desired spacing d between adjacent widths of a product material, comprising:
    a) depositing a form material on the surface of a product material;
    b) forming patterns of photolithographic masking materials spaced apart by a distance D;
    c) removing portions of the form material by etching to leave the patterns of form material with opposed sidewalls spaced apart by a distance D which is greater than spacing d by 2Δ and removing the photolithographic masking materials;
    d) depositing a layer of second masking material over the form material and product material, the layer of second masking material having a thickness correlating to Δ;
    e) removing portions of the second masking material by etching until the form material is exposed, leaving Δ widths of opposed second masking material contacting each of the opposed sidewalls of the form material, the distance between the opposed widths of second masking material being in a range down to 700 Å;
    f) removing portions of the form material and the product material not protected by the second masking material; and
    g) removing the remaining portions of the second masking material, leaving the product material formed into multiple capacitive plates, and wherein at least two of the capacitive plates are separated by spacing d;
    wherein the form material, masking material and product material are each individually selected from the group consisting of nitride, oxide, conductor and laminate combinations thereof, but the form material and the masking material are not the same member and the masking material and the product material are not the same member.

2. A process of claim 1 wherein the form material is nitride, the masking material is oxide, and the product material is a conductor.

3. A process for forming a desired spacing d between adjacent widths of a product material, comprising:
    a) depositing a form material on the surface of a product material;
    b) forming patterns of photolithographic masking materials spaced apart by a distance D;
    c) removing portions of the form material by etching to leave the patterns of form material with opposed sidewalls spaced apart by a distance D which is greater than spacing d by 2Δ and removing the photolithographic masking materials;
    d) depositing a layer of second masking material over the form material and product material, the layer of second masking material having a thickness correlating to Δ;
    e) removing portions of the second masking material by etching until the form material is exposed, leaving Δ widths of opposed second masking material contacting each of the opposed sidewalls of the form material, the distance between the opposed widths of second masking material being in a range down to 700 Å;
    f) removing portions of the form material and the product material not protected by the second masking material; and
    g) removing the remaining portions of the second masking material, leaving the product material formed into multiple capacitive plates, and wherein at least two of the capacitive plates are separated by spacing d;
    wherein the form material, masking material and product material are each individually selected from the group consisting of nitride, oxide, conductor and laminate combinations thereof, but the form material and the masking material are not the same member.

4. A process of claim 3 wherein the form material is nitride, the masking material is oxide, and the product material is a conductor.

5. A process for forming a desired spacing d between adjacent widths of a product material, comprising:
    a) depositing a form material on the surface of a product material;
    b) forming patterns of photolithographic masking materials spaced apart by a distance D;
    c) removing portions of the form material by etching to leave the patterns of form material with opposed sidewalls spaced apart by a distance D which is greater than spacing d by 2Δ and removing the photolithographic masking materials;
    d) depositing a layer of second masking material over the form material and product material, the layer of second masking material having a thickness correlating to Δ;
    e) removing portions of the second masking material by etching until the form material is exposed, leaving Δ widths of opposed second masking material contacting each of the opposed sidewalls of the form material, the distance between the opposed widths of second masking material being in a range down to 700 Å;
    f) removing portions of the form material and the product material not protected by the second masking material; and g) removing the remaining portions of the second masking material, leaving the product material formed into multiple capacitive plates, and wherein at least two of the capacitive plates are separated by spacing d;

wherein only a portion of the product material not protected by the masking material is removed.

6. A process of claim 5 wherein the form material is nitride, the masking material is oxide, and the product material is a conductor.

7. A process of claim 5 wherein the form material is oxide, the masking material is oxide, and the product material is a conductor.

8. A process of claim 5 wherein all of the product material not protected by the masking material is removed.

9. A process of claim 5 including removing the form material and the masking material by etching.

10. A method for forming multiple capacitor plates with at least two of the capacitor plates separated by a distance which is less than a minimum feature size, the method comprising:

depositing a first insulator on the surface of a conductor;

forming a mask pattern disposed over the first insulator, wherein the first insulator is exposed through a window in the mask pattern;

removing portions of the first insulator and the conductor to form an opening corresponding to the window, wherein an amount of the removed conductor correlates to a plate thickness;

depositing a second insulator over the first insulator and the exposed conductor, wherein a thickness of the second insulator correlates to a spacer width;

removing portions of the second insulator, wherein portions of the conductor are exposed and portions of the second insulator form spacers on opposite walls of the opening, and wherein a separation distance between the spacers is less than a feature size; and removing portions of the first insulator and the conductor which are not protected by the spacers, wherein the conductor is formed into a first capacitive plate of the plate thickness and a second capacitive plate of the plate thickness, and wherein the first capacitive plate is separated from the second capacitive plate by the separation distance.

* * * * *